United States Patent
Fogel et al.

(10) Patent No.: US 8,791,487 B2
(45) Date of Patent: Jul. 29, 2014

(54) ZINC OXIDE-CONTAINING TRANSPARENT CONDUCTIVE ELECTRODE

(71) Applicant: International Business Machines Corporation, Armonk, NY (US)

(72) Inventors: Keith E. Fogel, Hopewell Junction, NY (US); Ning Li, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/625,486

(22) Filed: Sep. 24, 2012

(65) Prior Publication Data

US 2014/0084251 A1    Mar. 27, 2014

(51) Int. Cl.
*H01L 33/42* (2010.01)
*H01L 51/52* (2006.01)

(52) U.S. Cl.
USPC 257/98; 257/99; 257/E33.064; 257/E51.019; 313/504; 313/506

(58) Field of Classification Search
USPC .............. 257/E51.018, E51.019, E51.02, 257/E51.021, E51.022, 43, 98, 99, 257/E33.064; 313/504, 506, 512
See application file for complete search history.

(56) References Cited

U.S. PATENT DOCUMENTS

| | | | |
|---|---|---|---|
| 6,593,593 B2 * | 7/2003 | Shinohara et al. | 257/72 |
| 7,495,387 B2 * | 2/2009 | Hayashi et al. | 313/505 |
| 2010/0102450 A1 * | 4/2010 | Narayan | 257/763 |
| 2012/0126273 A1 * | 5/2012 | Korotkov et al. | 257/98 |

OTHER PUBLICATIONS

X. Jiang, X. et al., "Aluminum-doped zinc oxide films as transparent conductive electrode for organic light-emitting devices," Appl. Phys. Lett., Sep. 1, 2003, 83, 1875.

Park, S.-H. K., et al., "Characteristics of Organic Light Emitting Diodes with Al-Doped ZnO Anode Deposited by Atomic Layer Deposition," Japanese Journal of Applied Physics, Jan. 28, 2005, vol. 44, No. 7, pp. L 242-L 245.

Tomita, Y., et al., "Highly efficient p-i-n-type organic light emitting diodes on ZnO:Al substrates," Appl. Phys., Aug. 8, 2007, Lett. 91, 063510.

Meyer, J., et al., "Indium-free transparent organic light emitting diodes with Al doped ZnO electrodes grown by atomic layer and pulsed laser deposition," Applied Physics Letters, Aug. 22, 2008, 93, 073308.

Tomita, Y., "Alternative transparent electrodes for organic light emitting diodes, doctoral dissertation," Technische Universität Dresden, 2008.

* cited by examiner

*Primary Examiner* — Matthew W Such
*Assistant Examiner* — Scott Stowe
(74) *Attorney, Agent, or Firm* — Scully, Scott, Murphy & Presser, P.C.; Louis J. Percello, Esq.

(57) ABSTRACT

A transparent conductive electrode stack containing a work function adjusted zinc oxide is provided. Specifically, the transparent conductive electrode stack includes a layer of zinc oxide and a layer of a work function modifying material. The presence of the work function modifying material in the transparent conductive electrode stack shifts the work function of the layer of zinc oxide to a higher value for better hole injection into the OLED device as compared to a transparent conductive electrode that includes only a layer of zinc oxide and no work function modifying material.

17 Claims, 3 Drawing Sheets

ZINC OXIDE-CONTAINING TRANSPARENT CONDUCTIVE ELECTRODE

BACKGROUND

The present disclosure relates to a transparent conductive electrode and a method of forming the same. More particularly, the present disclosure relates to a zinc oxide-containing transparent conductive electrode, an organic light emitting diode (OLED) device that includes the zinc oxide-containing transparent conductive electrode, and methods of forming the zinc oxide-containing transparent conductive electrode and the OLED device containing the same.

Organic light emitting diode device technology is emerging as a leading technology for displays and lighting. OLED displays posses key advantages including vibrant color, high contrast ratios, wide viewing angles and are flexible over conventional liquid crystal displays (LCDs). Moreover, OLED lighting is much more efficient than incandescent bulbs and has similar efficiency as the nitride based light emitting diodes (LEDs).

A typical OLED comprises a substrate which is usually made of glass or a similar transparent material. An anode layer is positioned on the substrate. The anode layer can be made of a material having a relatively high work function and is substantially transparent for visible light. A typical material for the anode layer is indium tin oxide (ITO). A layer of electroluminescent material is positioned on the anode layer, serving as the emitting layer of the OLED. Common materials for forming the emitting layer are polymers such as, for example, poly(p-phenylenvinylene) (PPV) and molecules like tris(8-oxychinolinato) aluminum ($Alq_3$). In the case of molecules, the emitting layer typically comprises several layers of the molecules. A cathode layer of material having a lower work function like aluminum (Al), calcium (Ca) or magnesium (Mg) is positioned on the emitting layer. During operation of the OLED, the cathode layer and the anode layer are connected to a power supply.

The basic principles of electroluminescence and, thus, of the OLED are the following: The anode layer and the cathode layer inject charge carriers, i.e., electrons and holes, into the emitting layer. In the emitting layer, the charge carriers are transported and the charge carriers of opposite charge form so called excitons, i.e., excited states. The excitons decay radiatively into the ground state by generating light. The generated light is then emitted by the OLED through the anode layer which is made of transparent material like ITO. The color of the generated light depends on the material used for the organic emitting layer.

SUMMARY

A transparent conductive electrode stack containing a work function adjusted zinc oxide electrode is provided. Specifically, a transparent conductive electrode stack is provided that includes, in any order, a layer of zinc oxide and a layer of a work function modifying material. The presence of the work function modifying material in the transparent conductive electrode stack of the present disclosure shifts the work function of the layer of zinc oxide to a higher value for better hole injection into the OLED device as compared to a transparent conductive electrode that includes only a layer of zinc oxide and no work function modifying material.

In one aspect of the present disclosure, a transparent conductive electrode stack is provided. In this aspect of the present disclosure the transparent conductive electrode stack includes a layer of zinc oxide, and a layer of a work function modifying material located on an exposed surface of the layer of zinc oxide.

In another aspect of the present disclosure, an organic light emitting diode (OLED) device is provided. In this aspect of the present disclosure, the OLED device includes a substrate; a transparent conductive electrode stack located on an exposed surface of the substrate; a layer of electroluminescent material located above the transparent conductive electrode stack; and a layer of a cathode material located on an exposed surface of the layer of electroluminescent material. In accordance with the present disclosure, the transparent conductive electrode stack includes a layer of zinc oxide, and a layer of a work function modifying material located on an exposed surface of the layer of zinc oxide.

In a further aspect of the present disclosure, a method of forming a transparent conductive electrode stack is provided. The method of forming the transparent conductive electrode stack includes providing a layer of zinc oxide; and forming a layer of a work function modifying material on an exposed surface of the layer of zinc oxide.

In yet another aspect of the present disclosure, a method of forming an organic light emitting diode (OLED) device is provided. The method of forming the OLED device includes providing a substrate; forming a transparent conductive electrode stack on a surface of the substrate, wherein the transparent conductive electrode stack comprises a layer of zinc oxide and layer of a work function modifying material on an exposed surface of the layer of zinc oxide; forming a layer of electroluminescent material on an exposed surface of the transparent conductive stack; and forming a layer of a cathode material on an exposed surface of the layer of electroluminescent material.

DETAILED DESCRIPTION

Figure 1:
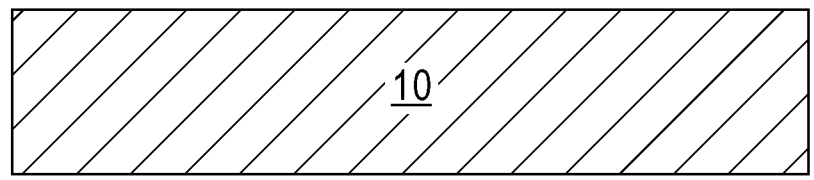
FIG. 1 is a pictorial representation (through a cross sectional view) illustrating a substrate that can be employed in one embodiment of the present disclosure.

The present disclosure, which provides a zinc oxide-containing transparent conductive electrode, an organic light emitting diode (OLED) device that includes the zinc oxide-containing transparent conductive electrode, and methods of forming the zinc oxide-containing transparent conductive electrode and the OLED device containing the same, will now be described in greater detail by referring to the following discussion and drawings that accompany the present application.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

In current OLED displays and lighting technologies, indium tin oxide transparent conductive electrodes are used as an anode. Such an OLED configuration has the following disadvantages. Transparent conductive electrodes containing indium tin oxide include the rare earth metal indium which is an expensive material thus increasing the cost of manufacturing indium tin oxide-containing OLED devices. Indium tin oxide-containing OLED devices easily fail after bending and are thus not suitable for flexible applications. Also, indium tin oxide is toxic and alternative materials for transparent conductive electrodes are thus needed.

In the present disclosure, the drawbacks mentioned above with respect to conventional indium tin oxide transparent conductive electrodes have been obviated by providing a zinc oxide-containing transparent conductive electrode. Specifically, a transparent conductive electrode stack is provided that includes a layer of zinc oxide and layer of a work function modifying material. The presence of the work function modifying material in the transparent conductive electrode stack of the present disclosure shifts the work function of the layer of zinc oxide to a higher value for better hole injection into the OLED device as compared to a transparent conductive electrode that includes only a layer of zinc oxide and no work function modifying material.

Although the following description illustrates the transparent conductive electrode stack of the present disclosure as a component of an OLED device, the zinc oxide-containing transparent conductive electrode of the present disclosure is not limited to being used in only such a device. Instead, the zinc oxide-containing transparent conductive electrode of the present disclosure can be used in other types of devices such as, for example, photovoltaic devices, solar cells, flat panel displays or touch screens.

Also, and although the present disclosure illustrates and describes that the transparent conductive electrode stack contains a bottom zinc oxide layer and an upper layer(s) of work function modifying material(s), the present disclosure is not limited to only such an embodiment. Instead, and in some embodiments of the present disclosure, particularly when the work function modifying material is comprised of a metal or metal dot, the layer of work function modifying material can be located beneath the layer of zinc oxide.

Referring to FIG. 1, there is illustrated a substrate 10 that can be employed in one embodiment of the present disclosure. The substrate 10 that can be employed in the present disclosure may be rigid or flexible and may include, for example, a semiconductor material, glass, a ceramic, tape, or a plastic. Typically, the substrate 10 that is employed in the present disclosure is a transparent substrate. In one embodiment of the present disclosure, the substrate 10 is transparent and is comprised of glass. In another embodiment of the present disclosure, the substrate 10 is transparent and is comprised of a plastic. The substrate 10 that is employed in the present disclosure may have a thickness from a few hundred microns to a few millimeters. In another embodiment, the substrate 10 that is employed may have a thickness from a few tens of microns to a few millimeters. The substrate 10 can have other thicknesses that are above and/or below the ranges mentioned above.

Figure 2:
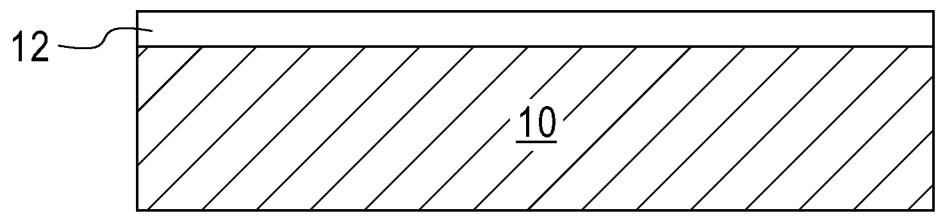
FIG. 2 is a pictorial representation (through a cross sectional view) illustrating the substrate of FIG. 1 after forming a layer of zinc oxide on an exposed surface of the substrate.

Referring to FIG. 2, there is illustrated substrate 10 after forming a layer of zinc oxide 12 on an exposed surface of the substrate 10. In some embodiments, and as illustrated in the drawings of the present disclosure, the layer of zinc oxide 12 serves as a transparent bottom electrode of an OLED device. In other embodiments, the layer of zinc oxide 12 can serve as a top electrode of the OLED device. In yet another embodiment, the layer of zinc oxide 12 can serve as an electrode of other types of devices such as, for example, photovoltaic devices, solar cells, flat panel displays, or touch screen devices.

The layer of zinc oxide 12 can be formed utilizing a deposition process including, for example, chemical vapor deposition, evaporation, chemical solution deposition, and atomic layer deposition. In one embodiment of the present disclosure, the layer of zinc oxide 12 can have a thickness from 100 nm to 2000 nm. The layer of zinc oxide 12 can have other thicknesses that are above and/or below the range mentioned above.

In one embodiment of the present disclosure, the deposited layer of zinc oxide 12 has a work function that is typically within a range from 3.5 eV to 4.5 eV. It is noted that the work function values for the as deposited layer of zinc oxide are substantially lower than the Fermi level of the electroluminescent material. As such, hole injection into the electroluminescent material using only a zinc oxide layer as an electrode material is poor. The present disclosure solves this by forming a work function modifying material in proximity to the layer of zinc oxide 12.

Figure 3:
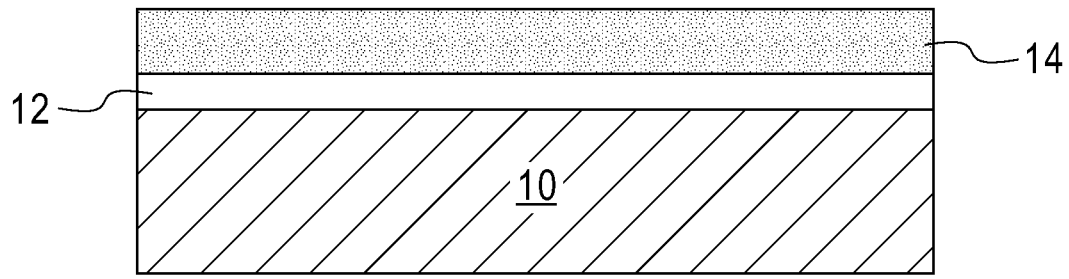
FIG. 3 is a pictorial representation (through a cross sectional view) illustrating the structure of FIG. 2 after forming a layer of a work function modifying material on an exposed surface of the layer of zinc oxide.

Referring now to FIG. 3, there is illustrated the structure of FIG. 2 after forming a layer of a work function modifying material 14 on an exposed surface of the layer of zinc oxide 12. The combination of the layer of zinc oxide 12 and the layer of work function modifying material 14 provides a transparent conductive electrode stack of the present disclosure. The presence of the layer of work function modifying material 14 within the transparent conductive electrode stack of the present disclosure increases the work function of the layer of zinc oxide and serves as a p-type dopant for the layer of zinc oxide.

Specifically, the layer of work function modifying material 14 within the transparent conductive electrode stack of the present disclosure increases the work function of the layer of zinc oxide 12 such that the work function of the layer of zinc oxide 12 'substantially' matches the Fermi level of the layer of electroluminescent material to be subsequently formed atop the transparent conductive electrode stack (i.e., elements 12 and 14). By "substantially matches" it is meant the layer of zinc oxide 12 when used in conjunction with the layer of work function modifying material 14 has a work function that is within less than 0.7 eV from the Fermi level of the layer of electroluminescent material. As such, better hole injection into the layer of electroluminescent material is provided by employing the transparent conductive electrode stack of the present disclosure.

Also, the layer of work function modifying material 14 within the transparent conductive electrode stack of the present disclosure increases the conductivity of the layer of zinc oxide 10 without losing transmittance.

In one embodiment of the present disclosure, the layer of work function modifying material 14 that can be employed in the present disclosure may be a single layered structure. In another embodiment of the present disclosure, the layer of work function modifying material 14 that can be employed in the present disclosure may be a multilayered structure comprises at least two distinct layers of work function modifying materials.

The work function modifying material 14 that can be employed in the present disclosure can be a metal oxide, a conductive polymer, a metal, an array of metal dots, or any combination thereof including, for example, a multilayered structure including a metal oxide and a conductive polymer.

Some specific examples of various transparent conductive electrode stacks of the present disclosure are illustrated in FIGS. 4A-4E. While these specific embodiments are shown and described, the transparent conductive electrode stack of the present disclosure is not limited to those shown in FIGS. 4A-4E.

Figure 4A:
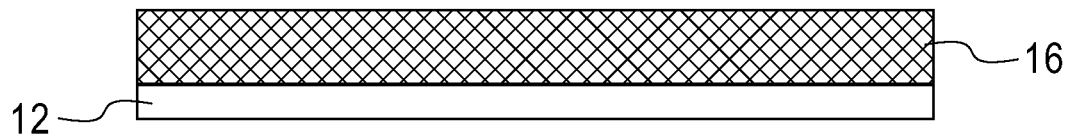
FIG. 4A is a pictorial representation (through a cross sectional view) illustrating an embodiment of the present disclosure in which the transparent conductive electrode stack includes a layer of zinc oxide, and a layer of a metal oxide.
Figure 4B:
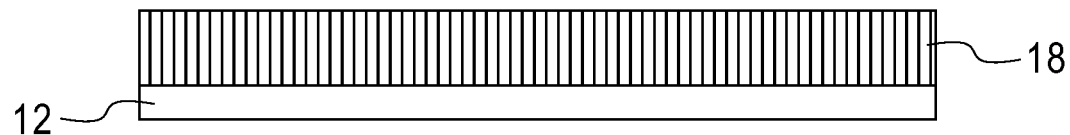
FIG. 4B is a pictorial representation (through a cross sectional view) illustrating an embodiment of the present disclosure in which the transparent conductive electrode stack includes a layer of zinc oxide, and a layer of a conductive polymer.
Figure 4C:
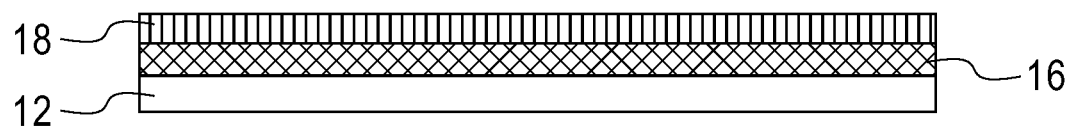
FIG. 4C is a pictorial representation (through a cross sectional view) illustrating an embodiment of the present disclosure in which the transparent conductive electrode stack includes a layer of zinc oxide, a layer of a conductive polymer and a layer of a metal oxide.
Figure 4D:
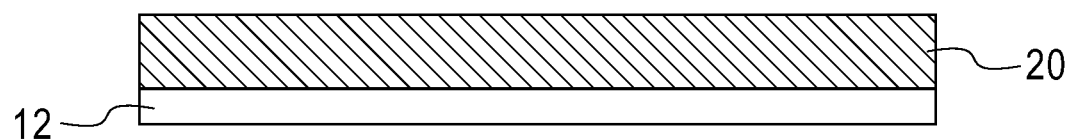
FIG. 4D is a pictorial representation (through a cross sectional view) illustrating an embodiment of the present disclosure in which the transparent conductive electrode stack includes a layer of zinc oxide, and a layer of a metal.
Figure 4E:
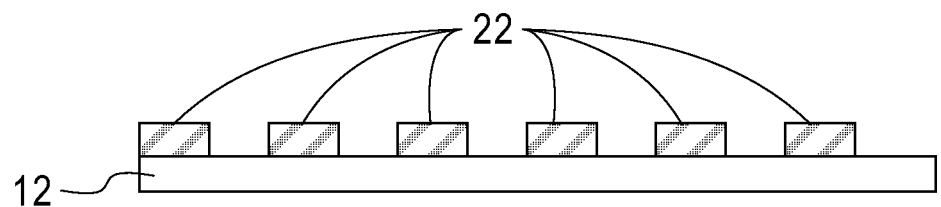
FIG. 4E is a pictorial representation (through a cross sectional view) illustrating an embodiment of the present disclosure in which the transparent conductive electrode stack includes a layer of zinc oxide, and an array of metal dots.

Specifically, FIG. 4A illustrates an embodiment of the present disclosure in which the transparent conductive electrode stack includes a layer of zinc oxide 12 and a layer of a metal oxide 16 as the layer of work function modifying material 14. FIG. 4B illustrates an embodiment of the present disclosure in which the transparent conductive electrode stack includes a layer of zinc oxide 12, and a layer of a conductive polymer 18. FIG. 4C illustrates an embodiment of the present disclosure in which the transparent conductive electrode stack includes a layer of zinc oxide 12, a layer of a conductive polymer 18 and a layer of a metal oxide 16. FIG. 4D illustrates an embodiment of the present disclosure in which the transparent conductive electrode stack includes a layer of zinc oxide 12, and a layer of a metal 20, while FIG. 4E illustrates an embodiment of the present disclosure in which the transparent conductive electrode stack includes a layer of zinc oxide 12, and an array of metal dots 22. In the illustrated embodiments shown in FIGS. 4A-4E, elements 16, 18, 20 and 22 serves as the work function modifying material of the present disclosure.

When a metal oxide is employed as the work function modifying material 14, the metal oxide includes an element from Groups IIIB, VIB, VB, VIIB, VIIB, VIII or IIIA of the Periodic Table of Elements, with the proviso that the metal oxide is other than zinc oxide. Illustrated examples of metal oxides that can be employed in the present disclosure as work function modifying material 14 include, but are not limited to, $MoO_3$, $W_2O_5$, $Al_2O_3$, or combinations and multilayers thereof. The metal oxide can be formed utilizing any well known deposition process including, for example, evaporation, chemical solution deposition, chemical vapor deposition, and sputtering.

When a conductive polymer is employed as the layer of work function modifying material 14, the conductive polymer (which can be referred to as an intrinsically conductive polymer) includes an organic polymer that conducts electricity. Examples of conductive polymers that can be employed in the present disclosure include, for example, aromatic compounds containing no heteroatoms, aromatic compounds containing a nitrogen heteroatom, aromatic compounds containing a sulfur heteroatom, polymeric compounds containing double bonds and/or aromatic compounds that also contain double bonds. In some embodiments of the present disclosure, the conductive polymers that can be employed in the present disclosure as the layer of work function modifying material 14 are selected from polyanilines and poly(3,4-ethylenedioxythiophene)poly(styrenesulfonate) or PEDOT:PSS for short.

The conductive polymer can be formed utilizing any well known deposition process including, for example, evaporation, chemical solution deposition, spin-coating, or dip coating. In some embodiments of the present disclosure the application of a conductive polymer directly to a surface of a layer of zinc oxide 12 can also form a uniform contact with the layer of zinc oxide 12.

When a metal or metal dot is employed as the layer of work function modifying material 14, the metal or metal dot includes an element from Groups IIIB, IVB, VB, VIIB, VIIB, VIII or IIIA of the Periodic Table of Elements. Illustrated examples of metals or an array of metal dots include, but are not limited to, Au, Pd, Pt, W, Ag, and/or Al.

A metal film can be formed utilizing any well known deposition process including, for example, evaporation, chemical solution deposition, chemical vapor deposition, and sputtering. An array of metal dots can be formed by first depositing a metal and then patterning the same by photolithography and etching. Alternatively, an array of metal dots can be formed by deposition of a metal precursor through a mask which contains a preconfigured pattern formed therein.

In one embodiment of the present disclosure, the layer of work function modifying material 14 can have a thickness from 1 nm to 80 nm. In another embodiment, the layer work function modifying material 14 can have a thickness from 5 nm to 50 nm. The layer of work function modifying material 14 can have other thicknesses that are above and/or below the ranges mentioned above.

Figure 5:
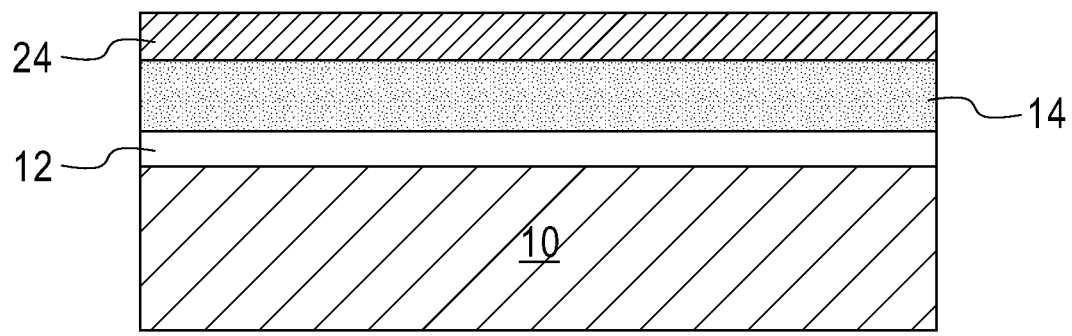
FIG. 5 is a pictorial representation (through a cross sectional view) illustrating the structure of FIG. 3 after forming a layer of an electroluminescent material on an exposed surface of the layer of work function modifying material.

Referring to FIG. 5, there is illustrated the structure of FIG. 3 after forming a layer of an electroluminescent material 24 above the transparent conductive electrode stack containing elements 12 and 14. The layer of electroluminescent material 24 that is employed in the present disclosure includes any organic material or multilayered stack of organic materials including, for example, organometallic chelates, conductive polymers, fluorescent dyes, phosphorescent dyes and conjugated dendrimers, that emits light in response to an electric current. Examples of organic materials that can be used as the electroluminescent material 24 include, but are not limited to, poly(p-phenylenvinylene) (PPV), poly(naphthalene vinylenes) (PNVs), tris(2-phenyl pyridine)iridium (Ir(ppy)$_3$), and tris(8-oxychinolinato) aluminum (Alq$_3$).

The layer of electroluminescent material 24 can be formed by conventional techniques including, for example, spin-on coating, dip coating, immersion, and chemical vapor deposition. Typically, and in one embodiment, the thickness of the layer of electroluminescent material 24 ranges from a few nm to a few hundred nm. Other thicknesses, including those above and/or below the aforementioned range can also be employed.

Figure 6:
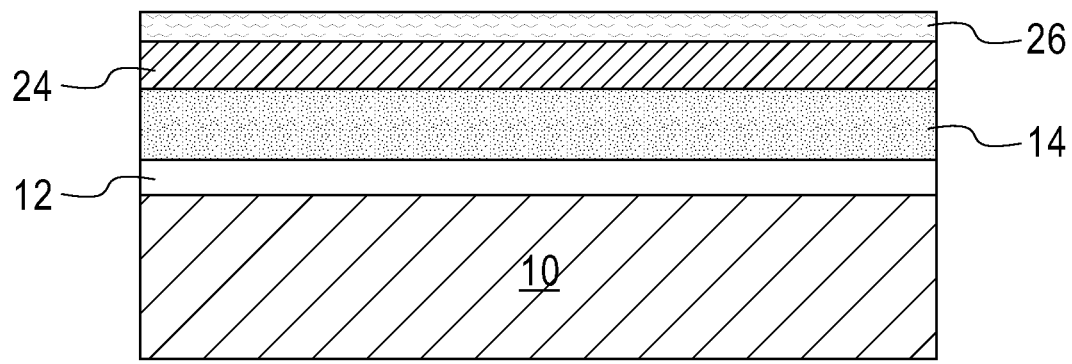
FIG. 6 is a pictorial representation (through a cross sectional view) illustrating the structure of FIG. 5 after forming a layer of a cathode material on an exposed surface of the layer of electroluminescent material.

Referring now to FIG. 6, there is illustrated the structure of FIG. 5, after formation of a layer of a cathode material 26 on an exposed surface of the layer of electroluminescent material 24. The layer of cathode material 26 can serve as an upper electrode of the OLED of the present disclosure. The layer of cathode material 26 that is employed in the present disclosure includes a material or a multilayered stack of materials having a lower work function than the transparent conductive electrode stack of doped graphene 12. In one embodiment of the present disclosure, the layer of cathode material 18 can be comprised of aluminum (Al), calcium (Ca) and/or magnesium (Mg). In some embodiments, the layer of cathode material may comprise a stack of LiF and Al.

The layer of cathode material 26 can be formed utilizing any deposition process including for example, thermal evaporation and sputtering. In some embodiments, the deposition process is performed through a shadow mask. Typically, and in one embodiment, the thickness of the layer of cathode material 26 ranges from 20 nm to 100 nm. Other thicknesses, including those above and/or below the aforementioned range can also be employed.

The transparent conductive electrode stack of the present disclosure which comprises a combination of the layer of zinc oxide 12 and the layer of work function modifying material 14 is typically less toxic than a conventional ITO transparent conductive electrode. Also, transparent conductive electrode stacks comprised of the combination of the layer of zinc oxide 12 and the layer of work function modifying material 14 are less expensive to fabricate than are their ITO counterparts. Further, transparent conductive electrode stacks comprised of the combination of the layer of zinc oxide 12 and the layer of work function modifying material 14 are more compatible with plastic substrates and thus can be used in a wide variety of display and lighting applications. Furthermore, transparent conductive electrode stacks comprised of the combination of the layer of zinc oxide 12 and the layer of work function modifying material 14 typically have a higher mechanical strength than their ITO counterpart electrodes. Moreover, the transparent conductive electrode stacks comprised of combination of the layer of zinc oxide 12 and the layer of work function modifying material 14 are chemically stable. By "chemically stable" it is meant that the transparent conductive electrode stack of the present disclosure can endure processing steps which include a strong acid, base, and/or solvent, and maintain its structural integrity.

When used as a component of an OLED device, the transparent conductive electrode stacks comprised of the combination of the layer of zinc oxide 12 and the layer of work function modifying material 14 can provide an OLED device that has electrical properties that are similar to, and in some embodiments, slightly improved as compared with, an OLED device containing a conventional ITO electrode.

In some embodiments, the transparent conductive electrode stacks comprised of the combination of the layer of zinc oxide 12 and the layer of work function modifying material 14 can provide an OLED device that has a same, or slightly higher quantum efficiency as compared to an OLED device containing a conventional ITO electrode. In some cases, the transparent conductive electrode stacks comprised of the combination of the layer of zinc oxide 12 and the layer of work function modifying material 14 can provide an OLED device that has a same quantum efficiency as compared to an OLED device containing a conventional ITO electrode. The external quantum efficiency without any out-coupling scheme is more than 20%.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A transparent conductive electrode stack comprising:
a layer of zinc oxide; and
a layer of a work function modifying material located on an exposed surface of the layer of zinc oxide, wherein said layer of work function modifying material comprises at least one of a metal oxide containing an element selected from the group consisting of Group IIIB and VIIB of the Periodic Table of Elements, a metal containing an element selected from IIIB, IVB, VB, VIB, VIIB, VIII and IIIA of the Periodic Table of Elements, and an array of metal dots containing an element selected from IIIB, IVB, VB, VIB, VIIB, VIII and IIIA of the Periodic Table of Elements.

2. The transparent conductive electrode of claim 1, wherein said layer of work function modifying material is located above said layer of zinc oxide.

3. The transparent conductive electrode of claim 1, wherein said layer of work function modifying material is located beneath said layer of zinc oxide.

4. The transparent conductive electrode of claim 1, wherein said layer of zinc oxide is located on a transparent substrate.

5. An organic light emitting diode (OLED) device comprising:
a substrate;
a transparent conductive electrode stack located on an exposed surface of the substrate;
a layer of electroluminescent material located above the transparent conductive electrode stack;
a layer of a cathode material located on an exposed surface of the layer of electroluminescent material, wherein said transparent conductive electrode stack comprises a layer of zinc oxide, and a layer of a work function modifying material located on an exposed surface of the layer of zinc oxide, wherein said layer of work function modifying material comprises at least one of a metal oxide containing an element selected from the group consisting of Group IIIB and VIIB of the Periodic Table of Elements, a metal containing an element selected from IIIB, IVB, VB, VIB, VIIB, VIII and IIIA of the Periodic Table of Elements, and an array of metal dots containing an element selected from IIIB, IVB, VB, VIB, VIIB, VIII and IIIA of the Periodic Table of Elements.

6. The OLED device of claim 5, wherein said layer of a work function modifying material is located above said layer of zinc oxide.

7. The OLED device of claim 5, wherein said layer of electroluminescent material is selected from the group consisting of poly(p-phenylenvinylene) (PPV), poly(naphthalene vinylenes) (PNVs), tris(2-phenyl pyridine)iridium (Ir(ppy)$_3$), and tris (8-oxychinolinato) aluminum (Alq$_3$).

8. The OLED device of claim 5, wherein said layer of cathode material comprises aluminum (Al), calcium (Ca), magnesium (Mg) or a combination thereof.

9. The OLED device of claim 5, wherein said substrate is transparent.

10. The OLED device of claim 9, wherein said substrate is comprised of glass or a plastic.

11. A transparent conductive electrode stack comprising:
a layer of zinc oxide; and
a layer of a work function modifying material located on an exposed surface of the layer
of zinc oxide, wherein said layer of work function material comprises a material stack of a metal oxide and a conductive polymer.

12. The transparent conductive electrode stack of claim 11, wherein said metal oxide contains an element selected from the group consisting of Group IIIB, IVB, VB, VIIB, and IIIA of the Periodic Table of Elements.

13. The transparent conductive electrode stack of claim 11, wherein said metal oxide consists of $MoO_3$.

14. The transparent conductive electrode stack of claim 11, wherein said metal oxide comprises $W_2O_5$ or $Al_2O_3$.

15. The transparent conductive electrode stack of claim 11, wherein said conductive polymer is selected from aromatic compounds containing no heteroatoms, aromatic compounds containing a nitrogen heteroatom, aromatic compounds containing a sulfur heteroatom, polymeric compounds containing double bonds and/or aromatic compounds that also contain double bonds.

16. The transparent conductive electrode of claim 15, wherein said conductive polymer is a polyaniline.

17. The transparent conductive electrode of claim 15, wherein said conductive polymer is poly(3,4-ethylenedioxythiophene) poly(styrenesulfonate).

* * * * *